(12) United States Patent
Lee et al.

(10) Patent No.: US 10,074,798 B2
(45) Date of Patent: Sep. 11, 2018

(54) METHOD OF MANUFACTURING ULTRASONIC PROBE

(71) Applicant: SAMSUNG MEDISON CO., LTD., Hongcheon-gun, Gangwon-do (KR)

(72) Inventors: Won-Hee Lee, Gangwon-do (KR); Jin-Ho Gu, Gangwon-do (KR); Jae-Yk Kim, Gangwon-do (KR)

(73) Assignee: SAMSUNG MEDISON CO., LTD., Gangwon-Do (KR)

( * ) Notice: Subject to any disclaimer, the term of this patent is extended or adjusted under 35 U.S.C. 154(b) by 743 days.

(21) Appl. No.: 14/560,902

(22) Filed: Dec. 4, 2014

(65) Prior Publication Data

US 2015/0158053 A1 Jun. 11, 2015

(30) Foreign Application Priority Data

Dec. 9, 2013 (KR) .................. 10-2013-0152642
Jul. 29, 2014 (KR) .................. 10-2014-0096762

(51) Int. Cl.
*H01L 41/314* (2013.01)
*H01L 41/18* (2006.01)
*H01L 41/047* (2006.01)
*H01L 41/332* (2013.01)
*H01L 41/319* (2013.01)
*H01L 41/317* (2013.01)
(Continued)

(52) U.S. Cl.
CPC ........ *H01L 41/314* (2013.01); *H01L 41/0471* (2013.01); *H01L 41/183* (2013.01); *H01L 41/317* (2013.01); *H01L 41/319* (2013.01); *H01L 41/332* (2013.01); *H01L 41/37* (2013.01); *B06B 1/064* (2013.01); *B06B 1/0622* (2013.01); *B06B 1/0629* (2013.01); *Y10T 29/42* (2015.01); *Y10T 156/11* (2015.01)

(58) Field of Classification Search
CPC . H01L 41/0471; H01L 41/183; H01L 41/314; H01L 41/317; H01L 41/319; H01L 41/332; H01L 41/37; Y10T 156/11; Y10T 29/42; B06B 1/0622; B06B 1/0629; B06B 1/064

See application file for complete search history.

(56) References Cited

U.S. PATENT DOCUMENTS 5,131,276 A    7/1992   Kibblewhite
5,655,276 A    8/1997   Pattanayak et al.
(Continued)

FOREIGN PATENT DOCUMENTS

JP        2004291528 A   *   10/2004
KR    10-2013-0078935 A     7/2013

OTHER PUBLICATIONS

Machine Translation of Japanese Patent Publication, JP 2004-291528, Oct. 2017.*

(Continued)

*Primary Examiner* — A. Dexter Tugbang
(74) *Attorney, Agent, or Firm* — McDermott Will & Emery LLP

(57) ABSTRACT

Provided is a method of manufacturing an ultrasonic probe. The method includes forming a sacrificial layer on a substrate; forming a plurality of openings in the sacrificial layer that are separated from one another; forming piezoelectric units by growing a piezoelectric element in each of the plurality of openings; and removing the sacrificial layer.

16 Claims, 11 Drawing Sheets

(i)

(i)

(ii)

(ii)

(51) Int. Cl.
*H01L 41/37* (2013.01)
*B06B 1/06* (2006.01)

(56) References Cited

U.S. PATENT DOCUMENTS

| | | | | |
|---|---|---|---|---|
| 5,938,612 | A | * 8/1999 | Kline-Schoder | ........ B06B 1/064 |
| | | | | 310/334 |
| 6,332,254 | B1 | * 12/2001 | Usui | ............ H01L 41/319 |
| | | | | 216/27 |
| 2001/0042291 | A1 | 11/2001 | Esashi et al. | |
| 2002/0060508 | A1 | * 5/2002 | Sudol | .............. Y10T 29/42 |
| | | | | 310/334 |
| 2005/0156491 | A1 | 7/2005 | Scott | |
| 2009/0108708 | A1 | * 4/2009 | Jiang | ............ B06B 1/0622 |
| | | | | 310/334 |
| 2011/0291207 | A1 | * 12/2011 | Martin | ............ Y10T 29/42 |
| | | | | 257/416 |
| 2013/0169112 | A1 | 7/2013 | Sea et al. | |

OTHER PUBLICATIONS

International Search Report dated Feb. 24, 2015 issued in International Patent Application No. PCT/KR2014/011832.

* cited by examiner (i)

(ii)

(i)

(ii)

(i)

(ii)

(i)

(ii)

(i)

(ii)

(i)

(ii)

(i)

(ii)

METHOD OF MANUFACTURING ULTRASONIC PROBE

RELATED APPLICATIONS

This application claims the benefit of Korean Patent Application No. 10-2013-0152642, filed on Dec. 9, 2013 and Korean Patent Application No. 10-2014-0096762, filed on Jul. 29, 2014, in the Korean Intellectual Property Office, the disclosures of which are incorporated herein in their entirety by reference.

BACKGROUND

1. Field

One or more embodiments of the present invention relate to a method of manufacturing an ultrasonic probe.

2. Description of the Related Art

In general, an ultrasonic diagnostic apparatus radiates an ultrasonic wave onto an object such as a person or an animal and detects an echo signal reflected by the object to display a tomogram of a tissue on a monitor and provides information needed to diagnose the object. The ultrasonic diagnostic apparatus includes an ultrasonic probe used to transmit an ultrasonic wave into the object and to receive an echo signal from the object.

Also, the ultrasonic probe includes a transducer that is mounted therein and converts an ultrasonic signal to an electrical signal and vice versa. In general, a transducer includes a set of multiple piezoelectric elements. Accordingly, an ultrasonic diagnostic apparatus having this structure irradiates an ultrasonic wave onto an object to be inspected, and then converts an echo signal of the radiated ultrasonic wave into an electrical signal to thereby generate an ultrasonic image by using the electrical signal.

An ultrasonic diagnostic apparatus that uses an ultrasonic probe is a useful medical tool, and may be used in detecting foreign substances in a living body, measuring a degree of damage, observation of a tumor, or observation of an embryo, etc. through the above process.

In general, piezoelectric elements may be formed by physically splitting a piezoelectric layer by using dicing equipment. More piezoelectric elements are necessary in order to obtain a better image. However, it is difficult in reality to manufacture a dicing blade having a small thickness. Also, although a thin piezoelectric element is necessary in order to generate a high-frequency ultrasonic wave, it is difficult to manufacture the thin piezoelectric element, and moreover, there are safety concerns about handling the same.

SUMMARY

One or more embodiments of the present invention include a method of manufacturing an ultrasonic probe including a piezoelectric element that is formed by using a growth method.

Additional aspects will be set forth in part in the description which follows and, in part, will be apparent from the description, or may be learned by practice of the presented embodiments.

According to one or more embodiments of the present invention, a method of manufacturing an ultrasonic probe, includes: forming a sacrificial layer on a substrate; forming a plurality of openings in the sacrificial layer that are separated from one another; forming a piezoelectric units by growing a piezoelectric element in each of the plurality of openings; and removing the sacrificial layer.

The method may further include, before forming the sacrificial layer, forming a first electrode unit by forming a plurality of first electrode elements that are separated from one another, wherein the plurality of openings and the plurality of first electrode elements respectively correspond to each other on a one-to-one basis.

The first electrode elements may be seeds of the piezoelectric elements.

The first electrode elements may be formed of a transparent conductive material.

A thickness of the sacrificial layer may be greater than a thickness of the piezoelectric units.

The sacrificial layer may be formed of a photosensitive material.

The photosensitive material may be a positive type photosensitive material.

The method may further include, before growing a plurality of piezoelectric elements, forming a first electrode unit by forming a first electrode element in each of the plurality of openings.

The method may further include, after growing a plurality of piezoelectric elements, forming a second electrode unit by forming a second electrode element in each of the plurality of openings.

The method may further include forming a matching unit on the second electrode unit.

The forming of a matching unit may include: forming a matching element on each second electrode element of each of the plurality of openings; and planarizing the matching elements.

The substrate may be a chip module substrate.

The substrate may include an absorption material.

A distance between adjacent piezoelectric elements among the plurality of piezoelectric elements may be 20 μm or less.

A thickness of at least one of the plurality of piezoelectric elements may be 200 μm or less.

The plurality of piezoelectric elements may be grown by using a sequence synthesis method.

The plurality of piezoelectric elements may be grown at a temperature of 200° C. or lower.

The plurality of openings may be arranged one-dimensionally or two-dimensionally.

According to one or more embodiments of the present invention, an ultrasonic probe includes: a substrate; an electrode unit including a plurality of electrode elements that are one-dimensionally or two-dimensionally spaced apart from one another on the substrate; and a piezoelectric unit including a plurality of piezoelectric elements respectively disposed on the plurality of electrode elements, wherein the plurality of piezoelectric elements respectively and directly contact the plurality of electrode elements.

A crystal structure of a portion of each of the plurality of piezoelectric elements that is adjacent to one of the plurality of electrode elements may be the same as a crystal structure of the one electrode element.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
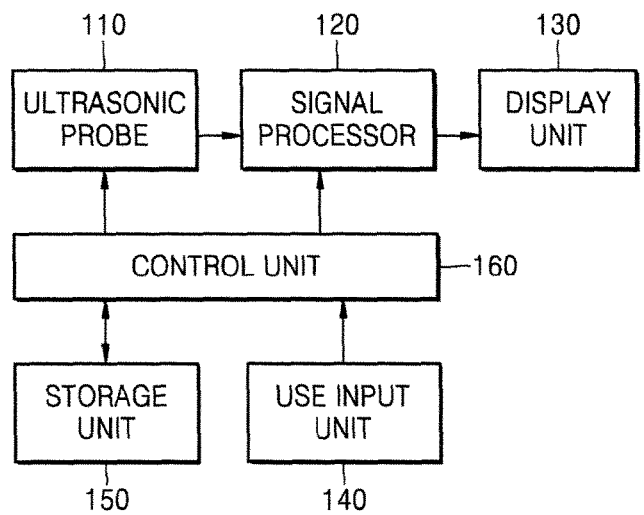
FIG. 1 is a block diagram illustrating an ultrasonic diagnostic apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

The embodiments of the invention will be described below in more detail with reference to the accompanying drawings. Those components that are the same or are in correspondence are rendered the same reference numeral regardless of the figure number, and redundant explanations are omitted.

Throughout the specification, an "object" may refer to a person, an animal or a portion of a person or an animal. For example, the object may be an organ such as a liver, heart, uterus, brain, breast, or stomach, or blood vessels. Also, throughout the specification, a "user" may refer to a medical specialist such as a doctor, nursing staff, a clinical pathologist, or a medical imaging specialist, or a service technician who repairs medical equipment but is not limited thereto.

FIG. 1 is a block diagram illustrating an ultrasonic diagnostic apparatus 100 according to an embodiment of the present invention. Referring to FIG. 1, the ultrasonic diagnostic apparatus 100 includes an ultrasonic probe 110 that transmits or receives an ultrasonic wave, a signal processor 120 that processes a signal applied via the ultrasonic probe 110 to generate an image, a display unit 130 that displays an image, a user input unit 140 that receives a user command, a storage unit 150 in which various information is stored, and a control unit 160 that controls the overall operation of the ultrasonic diagnostic apparatus 100.

The ultrasonic probe 110 is a device that transmits an ultrasonic wave to an object and receives an echo signal of the ultrasonic wave, which is reflected by the object, and will be described in detail later.

The signal processor 120 generates an ultrasonic image by processing ultrasonic data generated by using the ultrasonic probe 110. The ultrasonic image may be at least one of a B mode (brightness mode) image where amplitude of an ultrasonic echo signal reflected by an object is represented by luminance, a Doppler mode image where an image of a moving object is represented as a spectrum obtained by using Doppler effects, an M mode (motion mode) image where movement of an object according to time at a predetermined location is represented, an elastic mode image where an elastic property of an object, which is mapped when compression is applied and when no compression is applied (elastography), is represented as an image, and a C mode (color mode) image where a velocity of a moving object measured by using Doppler effects is represented in colors. As a method of generating an ultrasonic image, currently available methods of generating an image are used, and thus a detailed description thereof will be omitted. Accordingly, an ultrasonic image according to an embodiment of the present invention may include images in mode dimensions such as 1D, 2D, 3D or 4D.

The display unit 130 displays information processed by using the ultrasonic diagnostic apparatus 100. For example, the display unit 130 may display an ultrasonic image generated by using the signal processor 120, and may display, for example, a graphical user interface (GUI) to request a user input.

The display unit 130 may include at least one of a liquid crystal display (LCD), a thin film transistor-liquid crystal display (TFT-LCD), an organic light-emitting diode (OLED), a flexible display, a 3D display, and an electrophoretic display. The ultrasonic diagnostic apparatus 100 may include at least two display units 130 according to the form thereof.

The user input unit 140 refers to a unit of inputting data needed for a user to control the ultrasonic diagnostic apparatus 100. The user input unit 140 may include a keypad, a mouse, a touch panel, a track ball or the like. The user input unit 140 is not limited to the structure illustrated in FIG. 1 and may further include various input units such as a jog wheel or a jog switch.

Meanwhile, a touch panel may detect not only a real touch on a screen but also a proximity touch of a pointer approaching a screen at a predetermined distance. In the present specification, a pointer refers to an instrument for touching or hovering above a predetermined portion of a touch panel, and may be, for example, a stylus pen or a part of a body such as a finger.

Also, a touch panel may be implemented as a touch screen that forms a layer structure with the display unit 130 described above, and the touch screen may be implemented by using various methods such as a contact type electrostatic capacitance method, a pressure type resistive layer method, an infrared sensing method, a surface ultrasonic conduction method, an integration type tension measurement method, and a piezo effect method. As the touch screen functions not only as the display unit 130 but also as the user input unit 140, a utility degree of the touch screen is high.

Although not illustrated in FIG. 1, the touch panel may include various sensors inside or near the touch panel in order to sense a touch. An example of a sensor of the touch panel for sensing a touch is a tactile sensor. A tactile sensor refers to a sensor that senses a contact of a predetermined object to a same or greater degree than what a person senses. A tactile sensor may sense various information such as roughness of a contact surface, rigidness of a contacting object, or a temperature of a contacting point.

In addition, another example of a sensor of a touch panel for sensing a touch is a proximity sensor. A proximity sensor refers to a sensor that detects an object that is approaching a predetermined detection surface or that is present nearby the detection surface by using a force of an electromagnetic field or by using an infrared ray, without any mechanical contact. Examples of the proximity sensor include a transmissive photoelectric sensor, a direct reflective photoelectric sensor, a mirror reflective photoelectric sensor, a high frequency oscillation proximity sensor, an electrostatic capacitive proximity sensor, a magnetic proximity sensor, and an infrared proximity sensor.

The storage unit 150 stores various information that is processed in the ultrasonic diagnostic apparatus 100. For example, the storage unit 150 may store medical data related to diagnostic of an object, such as an image, or may store algorithms or programs that are executed in the ultrasonic diagnostic apparatus 100.

The storage unit 150 may include at least one type of storage medium selected from the group consisting of a flash memory type storage medium, a hard disk type storage medium, a multimedia card micro type storage medium, a card type memory (SD, XD memory, etc.), a random access memory (RAM), a static random access memory (SRAM), a read-only memory (ROM), an electrically erasable programmable read-only memory (EEPROM), a programmable read-only memory (PROM), a magnetic disk, and an optical disk. Also, the ultrasonic diagnostic apparatus 100 may operate web storage or a cloud server that performs the storage function of the storage unit 150 on the web.

The control unit 160 controls the overall operation of the ultrasonic diagnostic apparatus 100. That is, the control unit 160 may control operations of the ultrasonic probe 110, the signal processor 120, the display unit 130, etc. illustrated in FIG. 1. For example, the control unit 160 may control the signal processor 120 according to a user command input through the user input unit 140 or a program stored in the storage unit 150 such that the signal processor 120 generates an image. Also, the control unit 160 may control the signal processor 120 such that an image generated by using the signal processor 120 is displayed on the display unit 130.

Figure 2:
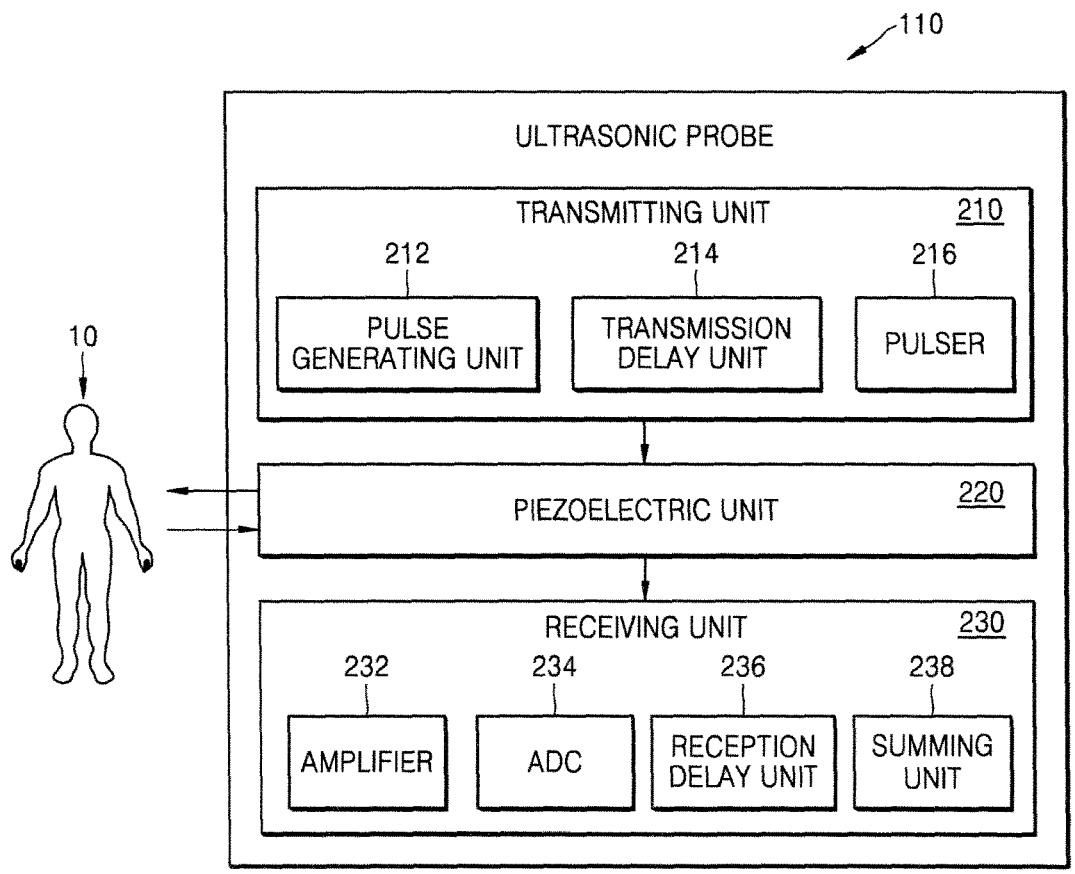
FIG. 2 is a block diagram illustrating an ultrasonic probe illustrated in FIG. 1.

FIG. 2 is a block diagram illustrating the ultrasonic probe 110 illustrated in FIG. 1. Referring to FIG. 2, the ultrasonic probe 110 is a device that is capable of transmitting an ultrasonic wave to the object 10 and receiving an echo signal reflected by the object 10, and may include a transmitting unit 210, a piezoelectric unit 220, and a receiving unit 230.

The transmitting unit 210 supplies a driving signal to the piezoelectric unit 220. The transmitting unit 210 may include a pulse generating unit 212, a transmission delay unit 214, and a pulser 216.

The pulse generating unit 212 generates a rate pulse used in generating a transmission ultrasonic wave according to a predetermined pulse repetition frequency (PRF). The transmission delay unit 214 applies a delay time for determining transmission directionality, to the rate pulse generated by the pulse generating unit 212. Each rate pulse to which a delay time is applied corresponds to each of a plurality of piezoelectric elements 222 included in the piezoelectric unit 220. The pulser 216 applies a driving signal (or a driving pulse) to the piezoelectric unit 220 at a timing corresponding to each rate pulse to which a delay time is applied.

The piezoelectric unit 220 transmits an ultrasonic wave to the object 10 according to a driving signal supplied from the transmission unit 210 and receives an echo signal of the ultrasonic wave, which is reflected by the object 10. The piezoelectric unit 220 may include a plurality of piezoelectric elements 222 that convert an electrical signal into an ultrasonic wave or vice versa.

The receiving unit 230 generates ultrasonic data by processing a signal transmitted by the piezoelectric unit 220, and may include an amplifier 232, an analog digital converter (ADC) 234, a reception delay unit 236, and a summing up unit 238.

The amplifier 232 amplifies a signal transmitted by the piezoelectric unit 220, and the ADC 234 analog-to-digital converts the amplified signal. The reception delay unit 236 applies a delay time for determining reception directionality, to the digitally converted signal. The summing up unit 238 generates ultrasonic data by summing up signals processed by the reception delay unit 236.

The transmitting unit 210 and the receiving unit 230 of the ultrasonic probe 110 may be formed as at least one chip on a substrate 240. The substrate 240 may be formed of Si, a ceramic, or a polymer based material. Alternatively, the substrate 240 may be formed of an absorption material that absorbs an ultrasonic wave. Each block in the transmitting unit 210 and the receiving unit 230 may be formed as a chip or at least two blocks may be formed as a chip, or a chip may be formed to correspond to each piezoelectric element 222. Thus, the substrate 240 in which at least one of the transmitting unit 210 and the receiving unit 230 is included is referred to as a chip module substrate. The chip module substrate 240 may refer to not only the substrate including all chips included in the ultrasonic probe 110 but also the substrate that includes some of the chips included in the ultrasonic probe 110.

Meanwhile, the ultrasonic probe 110 may also further include a partial element of the signal processor 120, a partial element of the display unit 130, and a partial element of the user input unit 140 in addition to the transmitting unit 210 and the receiving unit 230.

Figure 3:
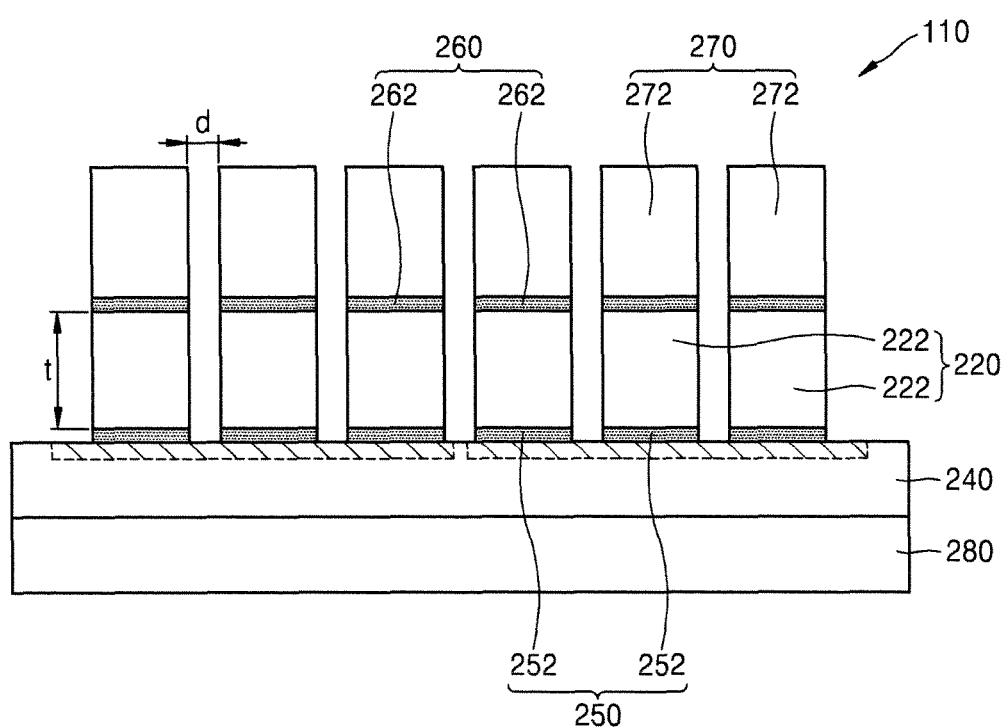
FIG. 3 is a schematic view illustrating a physical structure of the ultrasonic probe of FIG. 2.

FIG. 3 is a schematic view illustrating a physical structure of the ultrasonic probe 110 of FIG. 2. As illustrated in FIG. 3, the ultrasonic probe 110 includes the chip module substrate 240, the piezoelectric unit 220 that converts an ultrasonic wave to an electrical signal and vice versa, while vibrating, a first electrode unit 250 that is disposed between the piezoelectric unit 220 and the chip module substrate 240 and electrically connects the piezoelectric 220 and the chip module substrate 240, and a second electrode unit 260 that is disposed to face the first electrode unit 250 while including the piezoelectric unit 220 therebetween. As described above, the chip module substrate 240 refers to the substrate including at least one chip that processes an electrical signal. For example, at least one chip that performs operations of the receiving unit 230 and the transmitting unit 210 is formed on the chip module substrate 240. The chip module substrate 240 may be an application specific integrated circuit (ASIC) but is not limited thereto.

The piezoelectric unit 220 includes a plurality of piezoelectric elements 222 that convert an electrical signal to an ultrasonic wave and vice versa, while vibrating. The plurality of piezoelectric elements 222 may be separated from one another. The plurality of piezoelectric elements 222 according to the current embodiment of the present invention may be formed using a growth method. The method of manufacturing the piezoelectric elements 222 will be described later. The piezoelectric elements 222 may be formed of a material that generates a piezoelectric phenomenon. The material may include at least one of, for example, ZnO, AlN, $PZT(PbZrTiO_3)$, $PLZT(PbLaZrTiO_3)$, $BT(BaTiO_3)$, $PT(PbTiO_3)$, and $PMN-PT(Pb(Mg_{1/3}Nb_{2/3})O_3-PbTiO_3)$. A distance d between adjacent piezoelectric elements 222 among the plurality of piezoelectric elements 222 may be 20 µm or less, and a thickness of at least one of the piezoelectric elements 222 may be 200 μm or less.

The first electrode unit 250 electrically connects the piezoelectric unit 220 to the chip module substrate 240. The first electrode unit 250 may include a plurality of first electrode elements 252 that are separated from one another and respectively connect the piezoelectric elements 222 to the chip module substrate 240. Each of the first electrode elements 252 may electrically connect each of the piezoelectric elements 222 to the chip module substrate 240. Also, the first electrode elements 252 may be formed of a conductive material. In particular, the first electrode elements 252 may be formed of a metal and may be a seed layer of the piezoelectric elements 222.

The second electrode unit 260 may be disposed to face the first electrode unit 250 with the piezoelectric unit 220 included therebetween. The second electrode unit 260 may also include a plurality of second electrode elements 262 that are separated from one another. The second electrode unit 260 forms an electrical field in the piezoelectric unit 220 together with the first electrode unit 250. For example, a voltage having a predetermined amplitude may be applied to the first electrode unit 250, and the second electrode unit 260 may be grounded. The second electrode unit 260 may also be formed of a conductive material, and may be formed of a metal, a carbon nanostructure such as carbon nanotubes or graphenes, various types of conductive polymers such as polypyrrole, polyaniline, polyacetylene, polythiophene, polyphnylene vinylene, polyphenylene sulfide, poly p-phenylene, or polyheterocycle vinylene, a metal oxide such as indium tin oxide (ITO), aluminum zinc oxide (AZO), indium zinc oxide (IZO), tin oxide ($SnO_2$) or $In_2O_3$, or a metal nanoparticle-dispersed thin film of, for example, Al, Cu, Au, or Ag.

Also, the ultrasonic probe 110 includes an absorption unit 280 that absorbs an ultrasonic wave that is transmitted in an opposite direction to an object. The absorption unit 280 supports the chip module substrate 240 on a rear surface of the chip module substrate 240, and may absorb an ultrasonic wave that is transmitted to the back of the piezoelectric unit 220 and is not directly used in an examination or diagnostic. While the absorption unit 280 is formed as a separate layer from the chip module substrate 240, this is merely for convenience of description and the embodiments of the present invention are not limited thereto. The chip module substrate 240 may be formed of an absorption material. Thus, the chip module substrate 240 may function as the absorption unit 280.

In addition, the ultrasonic probe 110 may further include a matching unit 270 that matches an acoustic impedance of an ultrasonic wave generated in the piezoelectric unit 220, with an acoustic impedance of an object. The matching unit 270 is disposed on a front surface of the piezoelectric unit 220, and may modify the acoustic impedance of an ultrasonic wave generated in the piezoelectric unit 220 in stages so that the acoustic impedance of the ultrasonic wave is close to that of the object. The front surface of the piezoelectric unit 220 may refer to a surface thereof that is relatively close to the object while an ultrasonic wave is radiated to the object, and a rear surface of the piezoelectric unit 220 may refer to a surface opposite to the front surface.

The matching unit 270 may be formed of a plurality of matching elements 272 that are respectively disposed on the piezoelectric elements 222. However, the embodiments of the present invention are not limited thereto. The matching unit 270 may include a single matching element 272 formed of a plurality of piezoelectric elements 222 that are arranged in a group. The matching unit 270 may be formed as a single layer or a multi-layer structure.

Also, the ultrasonic probe 110 may further include an acoustic lens (not shown) that focuses an ultrasonic wave. The acoustic lens is disposed on the front surface of the piezoelectric unit 220, and focuses the ultrasonic wave generated in the piezoelectric unit 220. The acoustic lens may be formed of a material such as silicon rubber, which has an acoustic impedance close to that of the object. Also, the shape of the acoustic lens may have a center portion that is convex or flat. The acoustic lens may have various shapes according to a design by a designer.

Figure 4A:
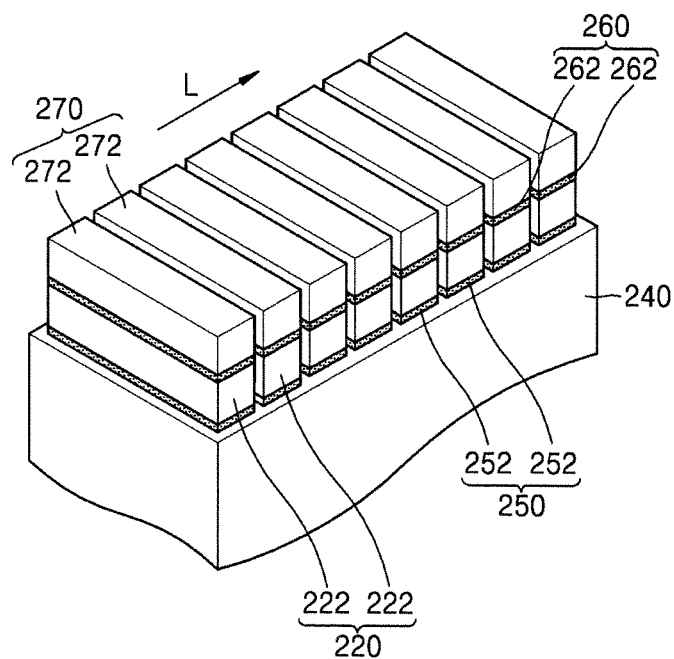
FIGS. 4A and 4B illustrate an arrangement of piezoelectric elements in a piezoelectric unit according to an embodiment of the present invention.
Figure 4B:
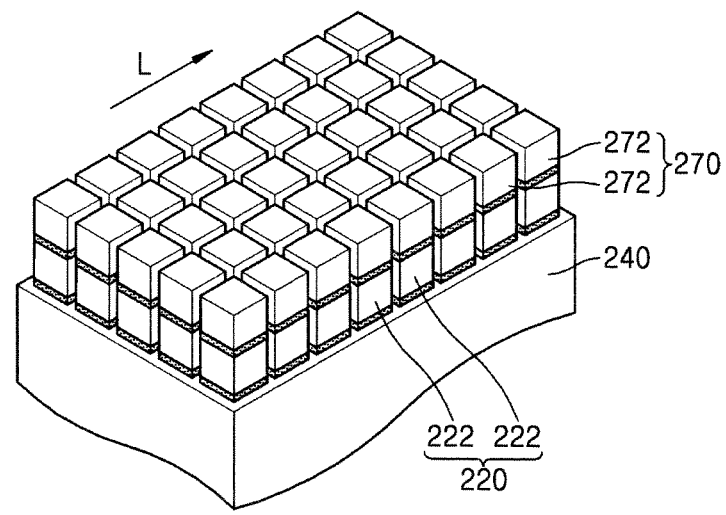

FIGS. 4A and 4B illustrate an arrangement of the piezoelectric elements 222 in the piezoelectric unit 220. As illustrated in FIG. 4A, the piezoelectric elements 222 may be arranged one-dimensionally in a length direction L of the piezoelectric unit 220 on the front surface of the first electrode unit 250. The piezoelectric elements 222 arranged in this manner may be referred to as a one-dimensional piezoelectric unit. The one-dimensional piezoelectric unit may be a linear array or may also be a curved array. The shape of the array may be variously set according to an intention of the designer. The one-dimensional piezoelectric unit is easy to manufacture and thus the manufacturing price thereof is low. However, it is difficult to form a three-dimensional stereoscopic image by using the one-dimensional piezoelectric unit.

As illustrated in FIG. 4B, the piezoelectric elements 222 may be arranged two-dimensionally not only along the length direction L of the piezoelectric unit 220 but also in a direction perpendicular to the length direction L. This may be referred to as a two-dimensional piezoelectric unit. The two-dimensional piezoelectric unit may be a linear array but may also be a curved array. The shape of the array may be variously set according to the intention of the designer. The two-dimensional piezoelectric unit transmits an ultrasonic wave to an object along an external scan line through which an ultrasonic wave is transmitted by appropriately delaying an input time of signals that are respectively input to the piezoelectric elements 222. Accordingly, a stereoscopic image is obtained by using the plurality of echo signals. Meanwhile, the higher the number of piezoelectric elements 222, the clearer the ultrasonic image obtained.

FIGS. 5 through 11 are reference diagrams illustrating a method of manufacturing an ultrasonic probe according to an embodiment of the present invention. In each of FIGS. 5 through 11, diagram (i) is a perspective view illustrating a method of manufacturing an ultrasonic probe, and diagram (ii) is a cross-sectional view illustrating the method of manufacturing the ultrasonic probe.

Figure 5:
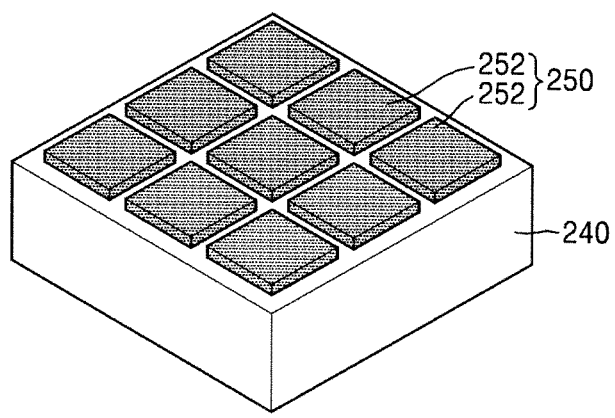
FIGS. 5 through 11 are reference diagrams illustrating a method of manufacturing an ultrasonic probe according to an embodiment of the present invention.
Figure 5:
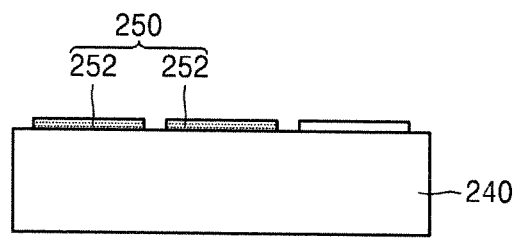

First, as illustrated in FIG. 5, the first electrode unit 250 is formed on the substrate 240. The substrate 240 may be the chip module substrate. The first electrode unit 250 may be formed on an area of the substrate 240 where electrical connection is necessary. The first electrode unit 250 may be formed of the plurality of first electrode elements 252 that are separated from one another. For example, the first electrode unit 250 may be formed by coating an area of the substrate 240 where electrical connection is necessary, with a conductive material, by using a mask, or by coating the substrate 240 with a conductive material and then etching areas except those where electrical connection is necessary, by using a mask. The plurality of first electrode elements 252 may be arranged one-dimensionally or two-dimensionally, or may be arranged in a matrix. Although FIG. 5 illustrates a plurality of first electrode elements 252 that are arranged two-dimensionally, the embodiments of the present invention are not limited thereto.

Figure 6:
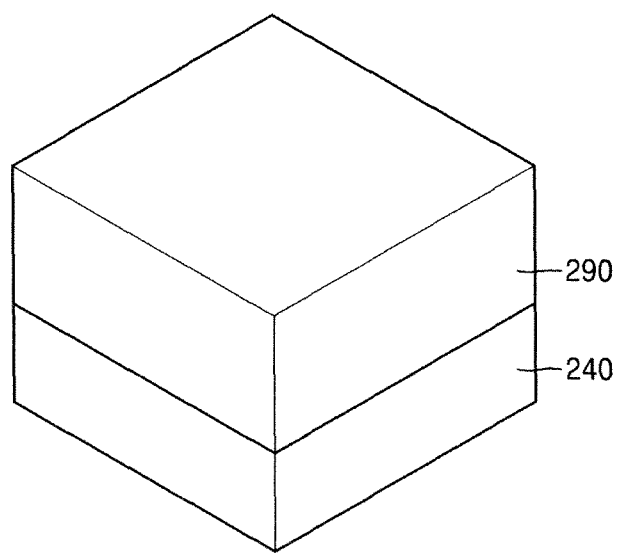
Figure 6:
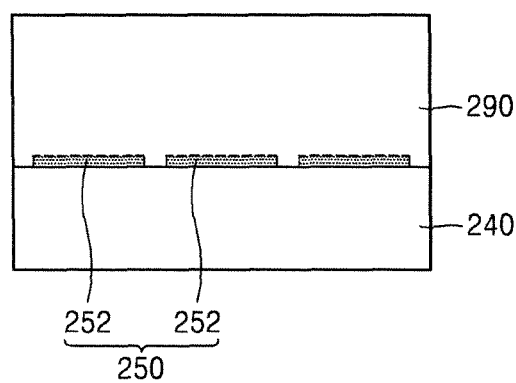

Then, as illustrated in FIG. 6, a sacrificial layer 290 may be formed on the substrate 240 on which the first electrode unit 250 is formed. The sacrificial layer 290 may be formed of a photosensitive material. As a photosensitive material, an organic material having positive type characteristics whose portion to which light is irradiated is removed, for example, a positive type photoresist, may be used. For example, a photosensitive material may be formed of a solid powder having the characteristics of chemically reacting with light and a volatile solvent. Viscosity of a photosensitive material may be adjusted by adjusting a ratio between solid powder and a solvent. Also, the photosensitive material may include a surfactant. The surfactant allows a uniform thickness of the photosensitive material. The thickness of the sacrificial layer 290 may be equal to a sum of thicknesses of the first electrode unit 250, the piezoelectric unit 220, the second electrode unit 260, and the matching unit 270.

Figure 7:
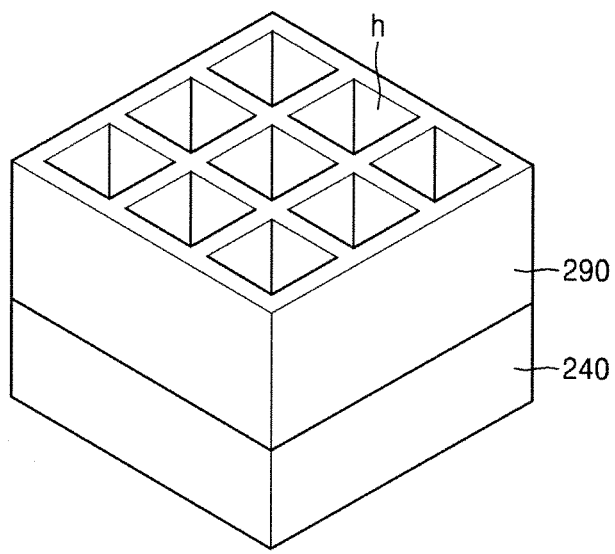
Figure 7:
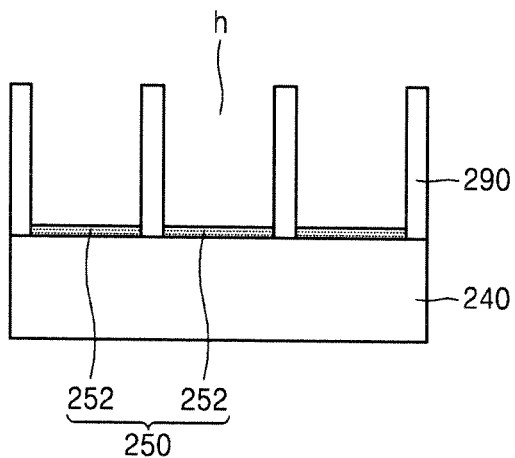

Also, as illustrated in FIG. 7, a plurality of openings h that are separated from one another may be formed in the sacrificial layer 290. For example, if a photosensitive material is a positive type, an exposure mask that exposes an area of the sacrificial layer 290 where the first electrode unit 250 is disposed is located on the sacrificial layer 290. Also, exposure is performed by using the exposure mask. A ultraviolet ray is typically used for light exposure, but is not limited thereto, and an electronic beam, an ion beam or an X-ray may also be used. An exposure amount may be any amount that is sufficient for the entire thickness of the photosensitive material to react with irradiated light so as to be removed. As portions of the sacrificial layer 290 are removed by performing exposure, the remaining sacrificial layer 290 having a plurality of openings h that are separated from one another as illustrated in FIG. 7 may be formed. If the first electrode unit 250 is transparent, light that has passed through the sacrificial layer 290 to be incident on the first electrode unit 250 is incident on the sacrificial layer 290 again, and thus, an exposure amount and exposure time may be reduced.

While the positive type photosensitive material has been described above as the photosensitive material, the embodiments of the present invention are not limited thereto. The photosensitive material may also be a negative type, and if the photosensitive material is a negative type, the sacrificial layer 290 that is not overlapped with the first electrode unit 250 is exposed, thereby forming the sacrificial layer 290 having openings h.

Also, while the sacrificial layer 290 having a plurality of openings h is formed after forming the first electrode unit 250 according to the current embodiment of the present invention, alternatively, the first electrode unit 250 may be formed after forming the sacrificial layer 290 having a plurality of openings h. That is, after forming the sacrificial layer 290 having a plurality of openings h by using an exposure mask and light, the first electrode unit 250 may be deposited in the openings h. As distances between the openings h may be adjusted by using light, it is easy to adjust the distances between the openings h. The distances between the openings h consequently refer to distances between the piezoelectric elements 222, and thus, it is easy to adjust the distances between the piezoelectric elements 222.

Figure 8:
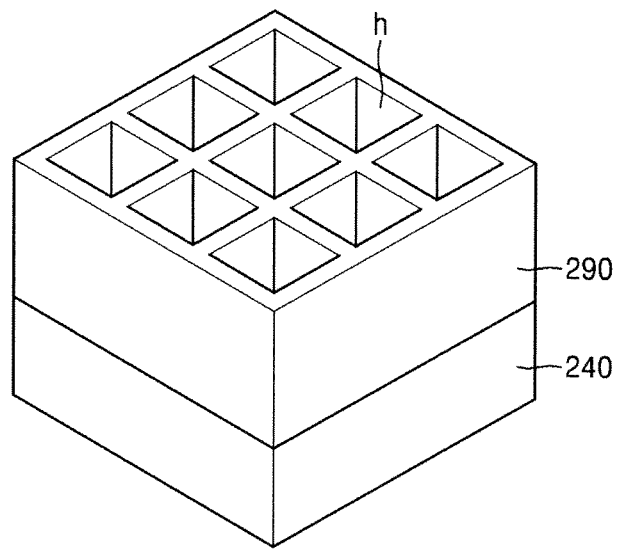
Figure 8:
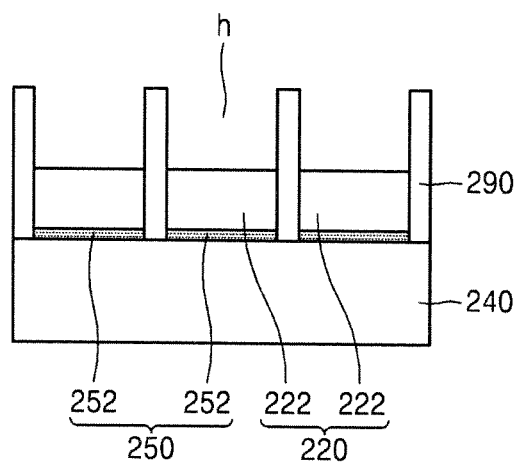

Then, as illustrated in FIG. 8, the plurality of piezoelectric elements 222 are grown in the openings h. The plurality of piezoelectric elements 222 may be grown by using a sequence synthesis method. For example, the substrate 240 of FIG. 7 is dipped in a chamber containing an aqueous solution including a piezoelectric material. Then, the piezoelectric elements 222 in the openings h may be grown via a sequence synthesis method. A temperature in the chamber may be 200° C. or lower. If the first electrode unit 250 is formed of a metal, the metal may be a seed layer of the piezoelectric elements 222, and thus, the piezoelectric elements 222 may be easily grown on the first electrode unit 250. If the first electrode unit 250 is not formed of a metal, a metal may be included as a seed layer in the openings h, and then the piezoelectric elements 222 may be grown.

Figure 9:
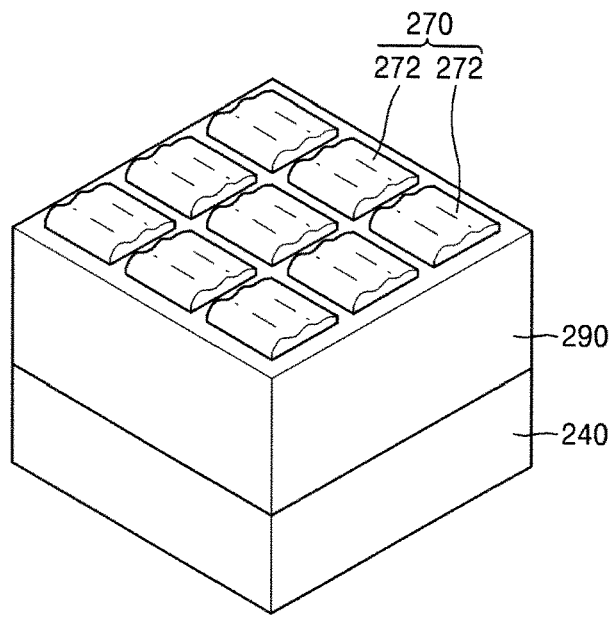
Figure 9:
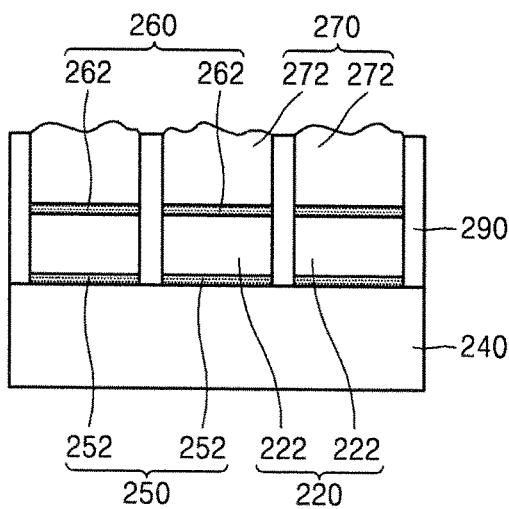

Then, as illustrated in FIG. 9, the second electrode unit 260 and the matching unit 270 may be sequentially formed on the piezoelectric unit 220. The second electrode unit 260 may be formed by forming a conductive material layer on each of the plurality of piezoelectric elements 222, and the matching unit 270 may be formed by forming a matching element 272 on each of a plurality of conductive material layers. The second electrode unit 260 formed on the piezoelectric unit 220 may also be formed of the same material as the first electrode unit 250.

Figure 10:
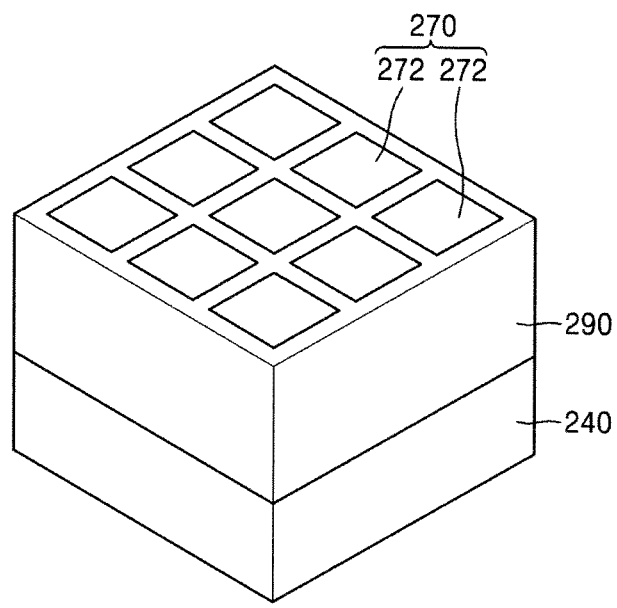
Figure 10:
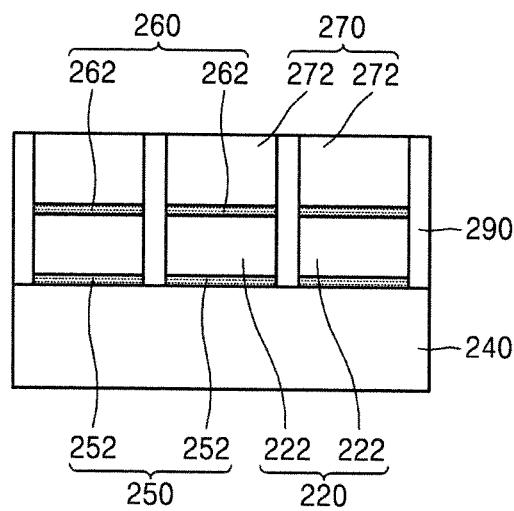
Figure 11:
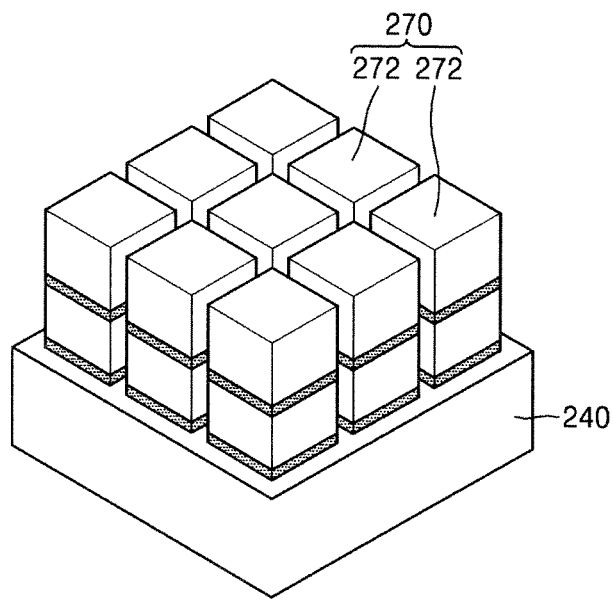
Figure 11:
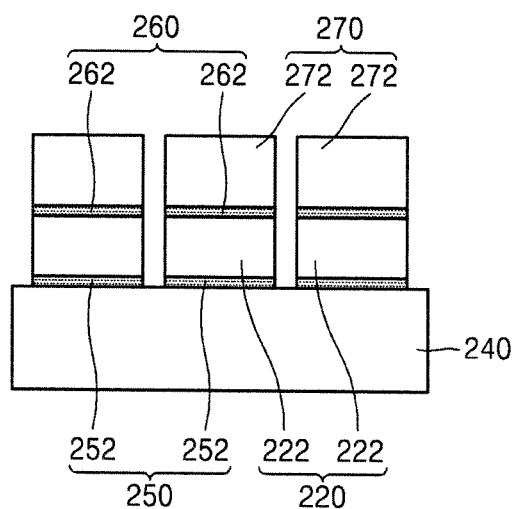

Then, as illustrated in FIG. 10, the matching unit 270 may be planarized, and the sacrificial layer 290 may be removed as illustrated in FIG. 11. The sacrificial layer 290 may be removed by exposing the sacrificial layer 290 to a development solution.

While not illustrated in the drawings, an acoustic lens may be stacked on the matching unit 270.

As the distances between the piezoelectric elements 222 may be adjusted, the distances between the piezoelectric elements 222 may be minutely adjusted, and thicknesses of the piezoelectric elements 222 may be easily adjusted by growing the piezoelectric elements 222. Thus, an ultrasonic probe whereby a high resolution image may be obtained may be manufactured.

As described above, a piezoelectric material is directly grown on an electrode unit or a seed layer (hereinafter, the electrode unit is also referred to as the 'seed layer'), and thus, the piezoelectric material according to an embodiment may have a crystal structure. For example, a portion of the piezoelectric material adjacent to the seed layer may have the same crystal structure as the seed layer. Consequently, no interface may be formed between the piezoelectric material and the seed layer. Alternatively, even if a dislocation is caused between the piezoelectric material and the seed layer due to particle differences between the piezoelectric material and the seed layer, the piezoelectric material may have a similar crystal structure to that of the seed layer.

However, if a piezoelectric material layer and other layer, such as a chip module substrate, are adhered to each other by using an adhesive in order to form an ultrasonic probe, an adhesive layer is formed between the piezoelectric material and the chip module substrate. In this case also, respective crystal structures of the piezoelectric material and the chip module substrate have no relevance to each other.

Figure 12:
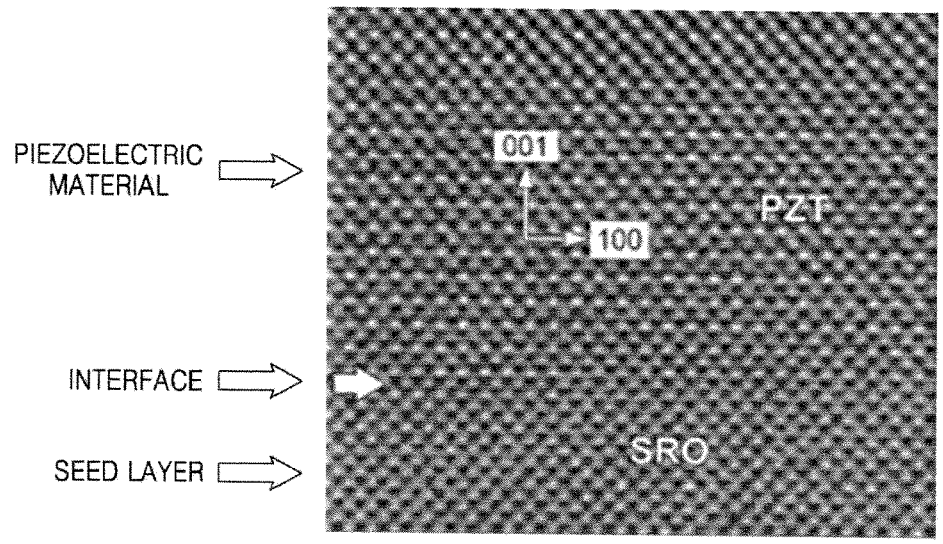
FIG. 12 is a high resolution-transmission electron microscope (HR-TEM) photographic image of a piezoelectric material grown on a seed layer, according to an embodiment.

In order to check a crystal structure according to a direct growth of a piezoelectric material, $SrRuO_3$ (SRO) is used as a seed layer and $PbZrTiO_3$ (PZT) is used as a piezoelectric material. The piezoelectric material is grown on the seed layer. FIG. 12 is a high resolution-transmission electron microscope (HR-TEM) photographic image of a piezoelectric material grown on a seed layer, according to an embodiment. As illustrated in FIG. 12, a crystal structure of the piezoelectric material is similar to that of the seed layer. Accordingly, an interface between the seed layer and the piezoelectric material is hardly formed.

Figure 13:
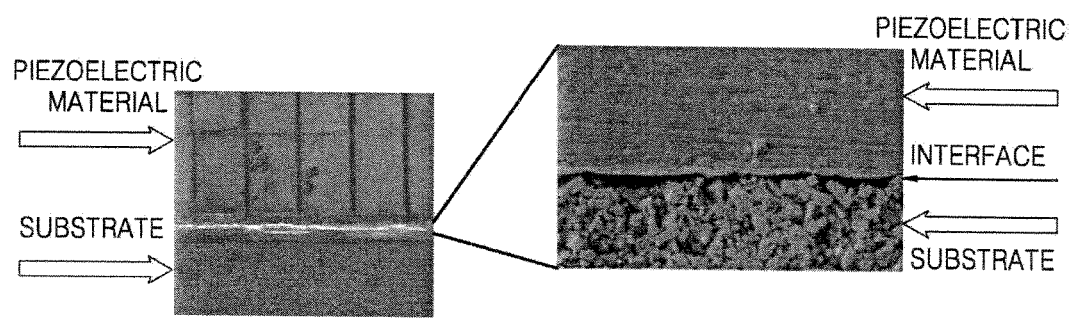
FIG. 13 is an HR-TEM photographic image of a piezoelectric material and a substrate that are adhered to each other by using an adhesive, according to an embodiment.

FIG. 13 is an HR-TEM photographic image of a piezoelectric material and a substrate that are adhered to each other by using an adhesive, according to an embodiment. As illustrated in FIG. 13, an adhesive is present between the piezoelectric material and the substrate, and a crystal structure of the piezoelectric material and a crystal structure of the substrate have no relevance to each other.

As the present invention allows for various changes and many different forms, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the inventive concept are encompassed in the inventive concept.

What is claimed is:

1. A method of manufacturing an ultrasonic probe, the method comprising:
    forming a sacrificial layer on a substrate;
    forming a plurality of openings in the sacrificial layer that are separated from one another;
    forming a piezoelectric unit by growing a plurality of piezoelectric elements each disposed in a respective opening of the plurality of openings;
    forming a plurality of first electrode elements each disposed in a respective opening of the plurality of openings on a respective piezoelectric element of the plurality of piezoelectric elements;
    forming a plurality of matching elements each disposed in a respective opening of the plurality of openings on a respective first electrode element of the plurality of first electrode elements; and
    removing the sacrificial layer.

2. The method of claim 1, further comprising, before the forming of the sacrificial layer, forming an electrode unit by forming a plurality of second electrode elements that are separated from one another on the substrate,
    wherein the plurality of openings and the plurality of second electrode elements respectively correspond to each other on a one-to-one basis.

3. The method of claim 2, wherein the second electrode elements are seeds of the piezoelectric elements.

4. The method of claim 2, wherein the second electrode elements are formed of a transparent conductive material.

5. The method of claim 1, wherein a thickness of the sacrificial layer is greater than a thickness of the piezoelectric unit.

6. The method of claim 1, wherein the sacrificial layer is formed of a photosensitive material.

7. The method of claim 6, wherein the photosensitive material is a positive type photosensitive material.

8. The method of claim 1, further comprising, before growing the plurality of piezoelectric elements, forming an electrode unit by forming a respective second electrode element in each of the plurality of openings.

9. The method of claim 1, further comprising:
    planarizing the matching elements before removing the sacrificial layer.

10. The method of claim 1, wherein the substrate is a chip module substrate.

11. The method of claim 1, wherein the substrate comprises an absorption material.

12. The method of claim 1, wherein a distance between adjacent piezoelectric elements among the plurality of piezoelectric elements is 20 μm or less.

13. The method of claim 1, wherein a thickness of at least one of the plurality of piezoelectric elements is 200 μm or less.

14. The method of claim 1, wherein the plurality of piezoelectric elements are grown by using a sequence synthesis method.

15. The method of claim 1, wherein the plurality of piezoelectric elements are grown at a temperature of 200° C. or lower.

16. The method of claim 1, wherein the plurality of openings are arranged one-dimensionally or two-dimensionally.

* * * * *